United States Patent [19]
Kajigaya et al.

[11] Patent Number: 4,967,396
[45] Date of Patent: Oct. 30, 1990

[54] SEMICONDUCTOR INTEGRATED CIRCUIT DEVICE

[75] Inventors: Kazuhiko Kajigaya; Osamu Tsuchiya, both of Ohme, Japan

[73] Assignee: Hitachi, Ltd., Tokyo, Japan

[21] Appl. No.: 471,073

[22] Filed: Jan. 29, 1990

Related U.S. Application Data

[63] Continuation of Ser. No. 173,097, Mar. 28, 1988, abandoned.

[30] Foreign Application Priority Data

Mar. 27, 1987 [JP] Japan .................. 62-71429

[51] Int. Cl.⁵ .................. G11C 11/40; G11C 13/00
[52] U.S. Cl. .................. 365/207; 365/189.01; 357/23.6
[58] Field of Search .................. 365/51, 149, 205, 207, 365/189.01; 357/23, 41

[56] References Cited

U.S. PATENT DOCUMENTS

| | | | |
|---|---|---|---|
| 4,733,374 | 3/1988 | Furuyama et al. .................. | 365/205 |
| 4,750,026 | 6/1988 | Kuninobu et al. .................. | 357/41 |
| 4,792,841 | 12/1988 | Nagasawa et al. .................. | 357/41 |
| 4,809,046 | 2/1989 | Aoyama et al. .................. | 357/41 |

OTHER PUBLICATIONS

"A 90ns 256K x 1b DRAM with Double Level Al Technology", Fujii et al., 1983, IEEE ISSCC, Feb. 25, 1983, pp. 226-227.

*Primary Examiner*—Terrell W. Fears
*Attorney, Agent, or Firm*—Antonelli, Terry, Stout & Kraus

[57] ABSTRACT

The present invention relates to a dynamic type RAM and, more particularly, to a dynamic type RAM formed using one-element type dynamic memory cells each comprised of a data storing capacitor and an address selecting MOSFET. Divided word lines are arranged such that one divided word line intersects another at a point of discontinuity of the other divided word line adjacent to a joint of the one divided word line to the corresponding word line. This prevents generation of an array noise due to coupling capacitances, and thus improves the read margin.

22 Claims, 6 Drawing Sheets

SEMICONDUCTOR INTEGRATED CIRCUIT DEVICE

This application is a continuation of application Ser. No. 173,097, field on Mar. 28, 1988, now abandoned.

BACKGROUND OF THE INVENTION

The present invention relates to a dynamic type RAM (random access memory) and, more particularly, to a technique which may be effectively utilized for a semiconductor integrated circuit device having a dynamic type RAM formed using one-element type dynamic memory cells each consisting of a data storing capacitor and an address selecting MOSFET.

As a result of the increase in the storage capacity of dynamic type RAMs, the chip size of the semiconductor substrate has become larger, and the distributed resistance of word lines which are formed from a polycrystalline silicon or the like has become a serious problem. As one of the solutions to this problem, the Al shunt method is known in which word lines are divided into appropriate lengths to define divided word lines which are coupled to word lines which are formed from an aluminum layer having a relatively large conductivity. The Al shunt method is described, for example, in "Digest of Technical Papers" of ISSCC, SESSION-XVI, February 1983, pp. 226-227.

SUMMARY OF THE INVENTION

One example of the Al shunt method is shown in FIG. 3. In the figure, divided word lines DWLa1 to DWLas and DWLb1 to DWLbs are provided. These divided word lines are coupled to word lines WLa and WLb, respectively, which are disposed in the corresponding rows (noting that the point of connection is marked with O in each case). To the divided word lines DWLa1 to DWLas and DWLb1 to DWLbs are coupled the gates of address selecting MOSFETs in a plurality of memory cells which are disposed in the corresponding rows. In this dynamic type RAM, each pair of adjacent memory cells share one drain region for their respective address selecting MOSFETs to thereby achieve a higher efficiency in layout. However, it has been revealed by the inventors of this application that the above-described Al shunt method suffers from the following problems. Namely, as the storage capacity of dynamic type RAMs further increases, it is necessary to reduce the occupied area of memory cells in order to achieve higher integration of the memory array portion. However, the reduction in the occupied area of data storing capacitors is limited because the electrostatic capacitance thereof must be ensured. For this reason, it is conventional practice to dispose each pair of adjacent memory cells sharing one drain region as close as possible to one another to thereby reduce the occupied area of the address selecting MOSFETs. In this case, since the shared drain region D and the data line DL cannot be directly coupled, a connection pad Pa is provided in order to couple the data line DL and the shared drain region D of address selecting MOSFETs which are disposed between each pair of adjacent divided word lines, as shown in FIG. 4 which is a sectional view taken along the line A-B of FIG. 3. Since the respective layout patterns of the connection pad Pa and the divided word lines are superposed one upon the other, coupling capacitors Cf1 and Cf2 (not shown) are respectively present between the pad Pa, and the divided word lines DWLa and DWLb, or, in other words, between the data line DL, and the divided word lines DWLa and DWLb, or, from an overall viewpoint, between the data line DL and the word lines WLa and WLb. The electrostatic capacitances of these coupling capacitors Cf1, Cf2 change in accordance with the degree of misalignment in the data line direction of the masks for forming the divided word lines and the connection pad at the time of fabrication of the integrated circuit. If the degree of misalignment of the masks increases, the electrostatic capacitance of one coupling capacitor decreases, whereas the electrostatic capacitance of the other coupling capacitor increases inversely.

The same change in the electrostatic capacitance is observed in all the memory cells which are coupled to the same divided word line. Accordingly, in the case where the divided word lines DWLa1 to DWLas and DWLb1 to DWLbs are coupled, respectively, to the word lines WLa and WLb (which are on the same sides as the corresponding divided word lines), and one of each pair of memory cells which share one drain region for their address selecting MOSFETs is coupled to the same word lines as shown in FIG. 3, changes in the coupling capacitances due to misalignment of the masks for the connection pad and the divided word lines results directly in changes in the coupling capacitances between the word and data lines. When the coupling capacitance of one word line becomes higher than a certain level due to the nonuniform distribution of coupling capacitances, a change in level of the data line which is caused in accordance with the data stored in a memory cell selected by the select operation of the word line is transferred as an array noise to a non-selected word line through the coupling capacitance. As a result, the address selecting MOSFET of a non-selected memory cell coupled to the non-selected word line is erroneously brought into a weak ON state, so that the read margin lowers. In addition, the data storing ability of the memory cell which is erroneously brought into an ON state lowers, and there is, therefore, a concern that the stored data may be destroyed.

It is a primary object of the present invention to provide a dynamic type RAM which is so designed that it is possible to prevent generation of an array noise due to nonuniform distribution of coupling capacitances between word and data lines and thereby improve the read margin.

The above and other objects and novel features of the present invention will become clear from the following description taken in conjunction with the accompanying drawings.

A typical one of the inventions disclosed in this application will be briefed as follows.

Divided word lines are arranged such that one divided word line intersects another adjacent to its joint to the corresponding word line. Thus, first memory cells which are disposed at one side of one group of pairs of memory cells each of which share one drain region for their address selecting MOSFETs and second memory cells which are disposed at the other side of another group of pairs of memory cells each sharing one drain region are coupled to each divided word line of each pair of adjacent divided word lines, the numbers of first and second memory cells being the same or substantially the same.

By virtue of the above-described means, even if the coupling capacitance formed between the drain coupling pad of one of the memory cells sharing one drain region for their address selecting MOSFETS and the corresponding divided word line changes due to misalignment of the masks, the change in teh coupling capacitance is canceled in terms of hte divided word line, that is, the word line, so that the coupling capacitors formed between each data line and a pair of adjacent word lines have substantially equal electorstatic capacitances. Thus, it is possible to realize a dynamic type RAM havign a reduced array noise and an improved rad margin.

BRIEF DESCIRPTION OF THE DRAWINGS

Figure 1:
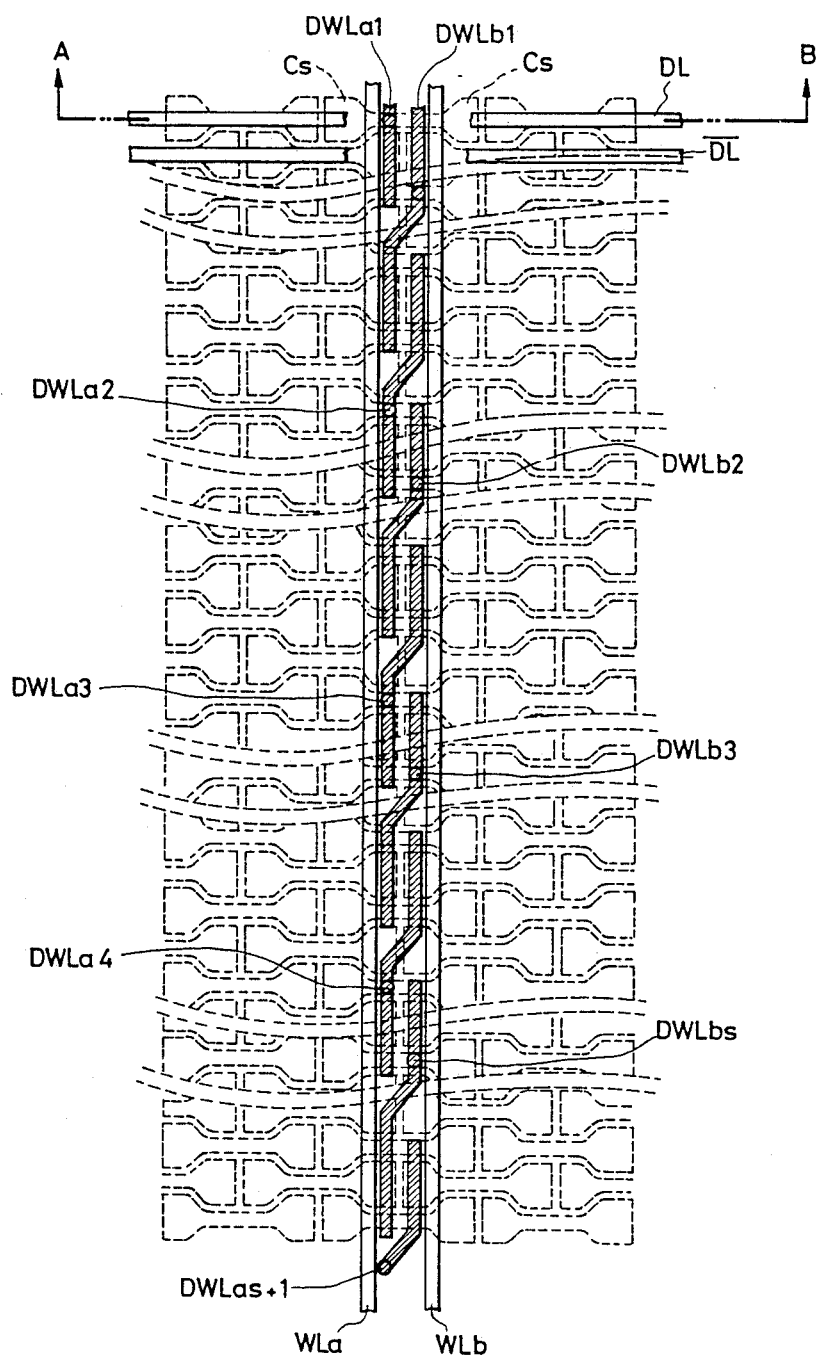
FIG. 1 shows the arrangement of a memory array of a dynamic type RAM in accordance with one embodiment of the present invention.
Figure 3:
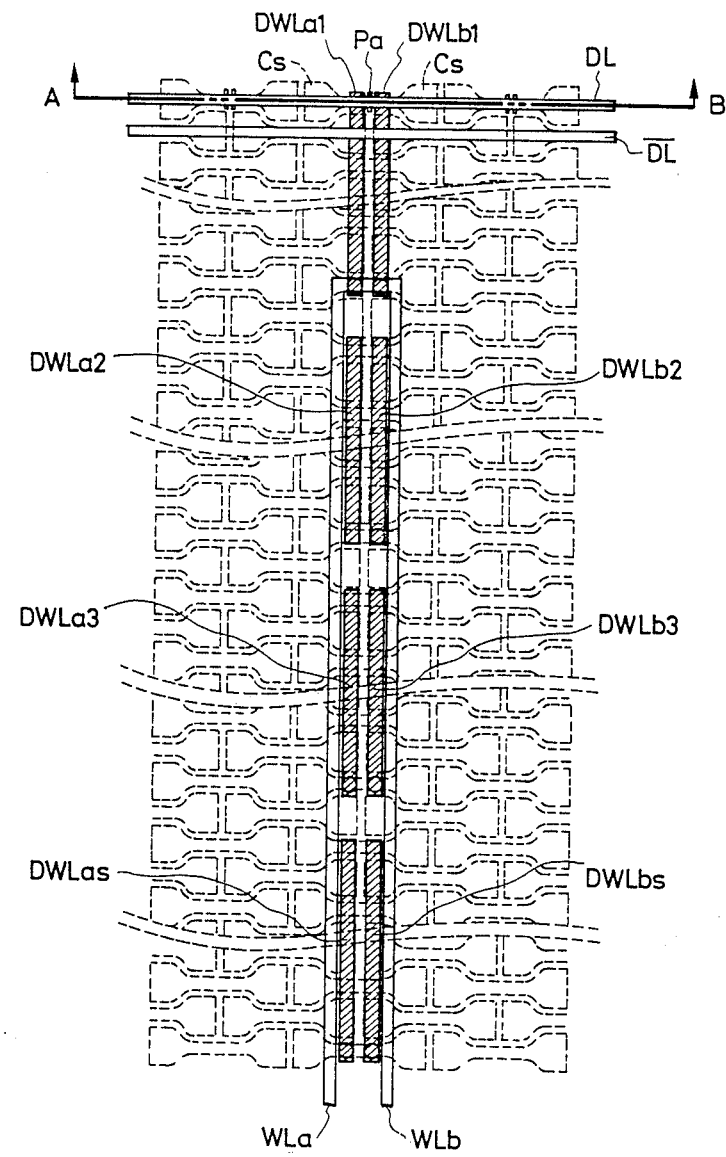
FIG. 3 shows the arrangement of one example of a memory array of a conventional dynamic type RAM.
Figure 4:
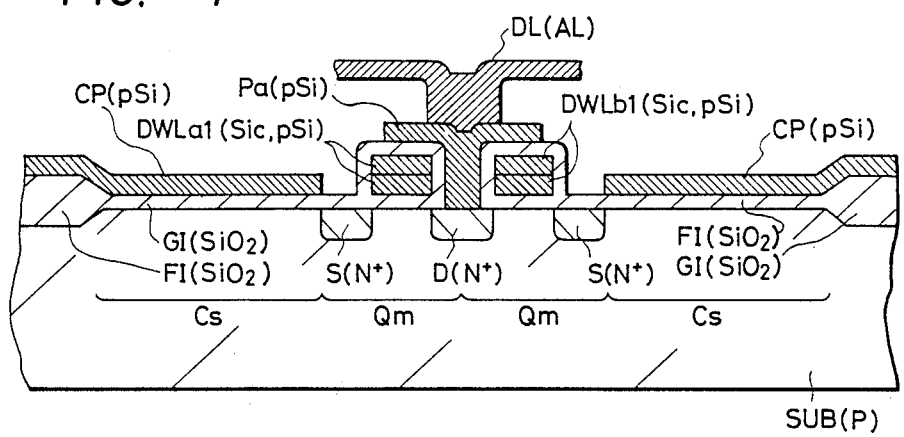
Figure 5:
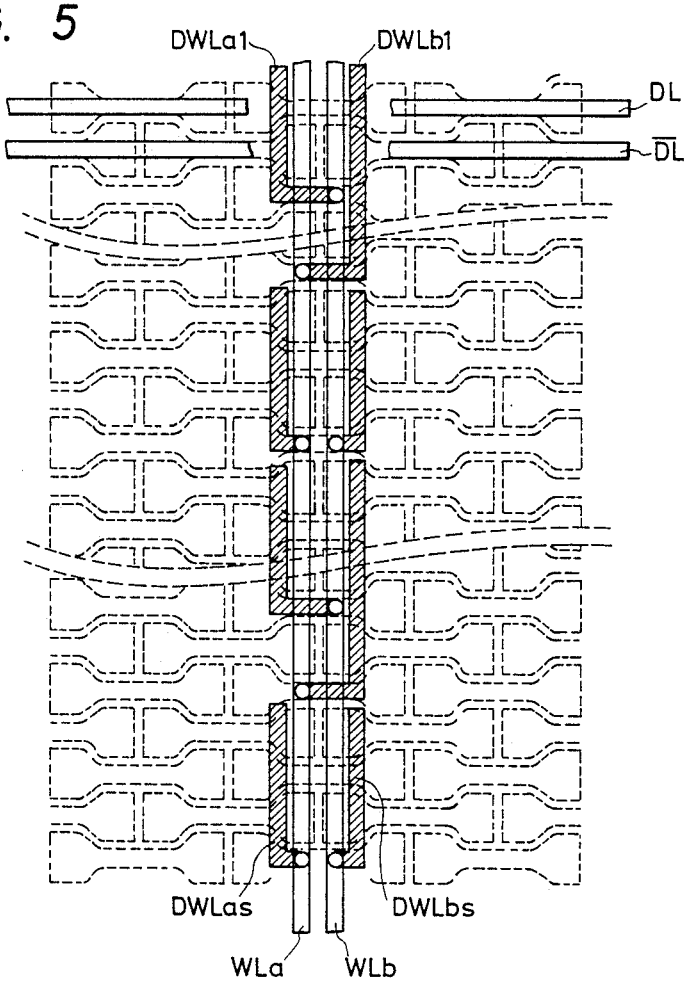
Figure 6:
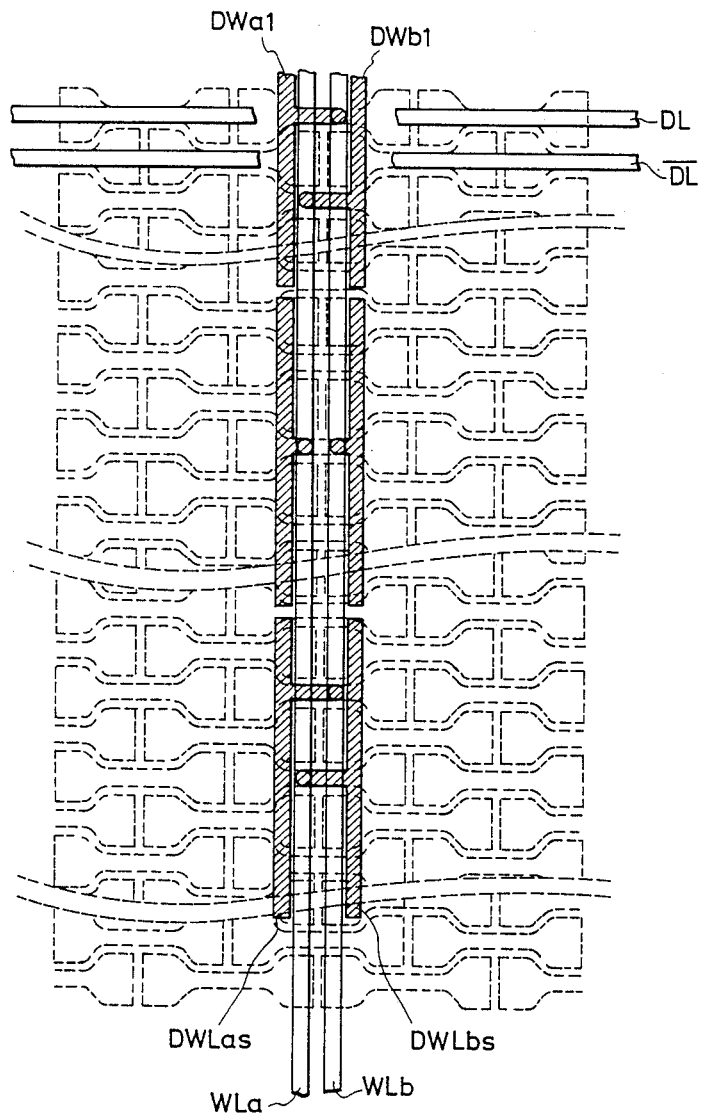
Figure 7:
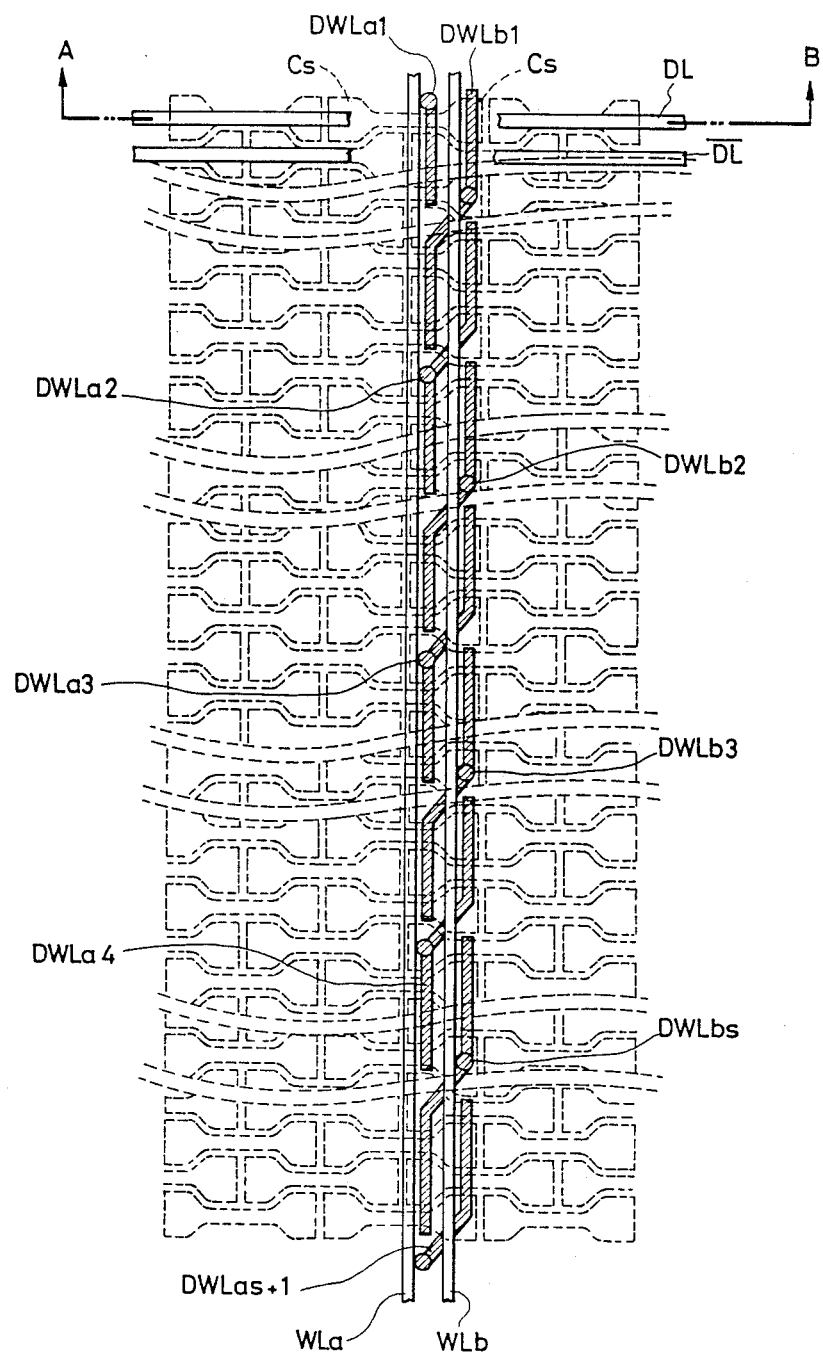

FIG. 4 is a sectional view taken along the line A-B of FIGS. 1 and 3, which shows a cross-section of the memory array of each of the dynamic type RAMs shown in FIGS. 1 and 3; and FIGS. 5, 6 and 7 respectively show the arrangements of memory arrays of dynamic type RAMs according to modifications of the embodiment of the present invention.

DESCRIPTION OF THE PREFERRED EMBODIMENTS

Figure 2:
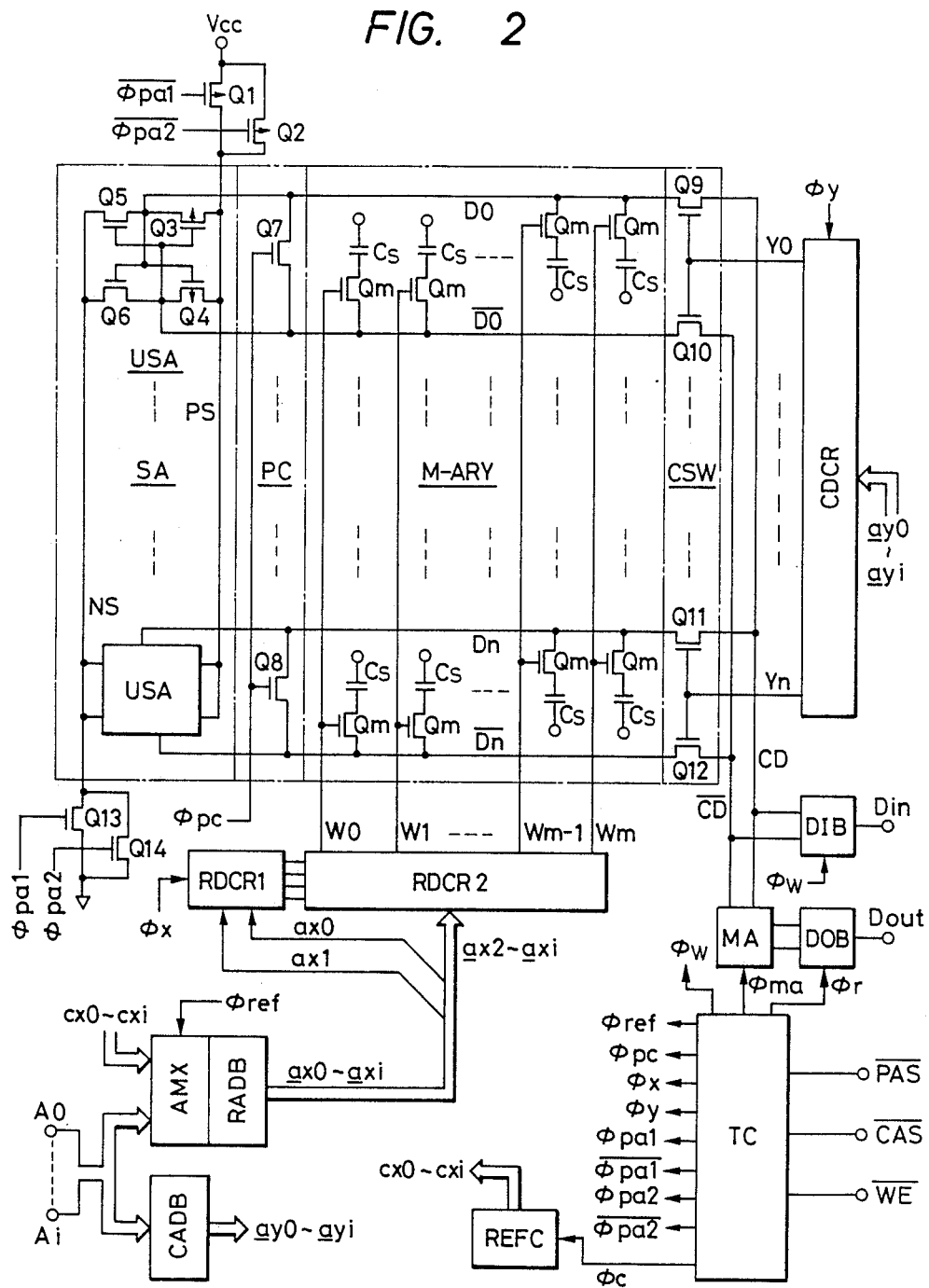
FIG. 2 is a circuit block diagram showing one embodiment of a dynamic type RAM to which the present invention is applied.

FIG. 2 is a circuit block diagram of one embodiment of a dynamic type RAM to which the present invention is applied. Each of the circuit elements shown in FIG. 2 is, although not necessarily limitative, formed on a semiconductor substrate made of single crystal P-type silicon by a known CMOS (complementary MOSFET) integrated circuit manufacturing technique.

Each of the N-channel MOSFETs consists of source and drain regions formed in the surface region of the semiconductor substrate and a gate electrode made of polycrystalline silicon (polysilicon) which is formed on the semiconductor substrate through a thin gate insulating film between the source and drain regions. P-channel MOSFETs are formed in an N-type well region which is formed in the semiconductor substrate. Thus, the semiconductor substrate defines a common substrate gate of a plurality of N-channel MOSFETs formed thereon, while the N-type well region defines a common substrate gate of a plurality of P-channel MOSFETs formed thereon.

In FIG. 2, a memory array M-ARY is, although not necessarily limitative, arranged according to the folded-bit line method. The memory array M-ARY consists of m+1 word lines W0 to Wm which are disposed so as to extend vertically as viewed in FIG. 2, n+1 pairs of complementary data lines DO·$\overline{DO}$ to Dn·$\overline{Dn}$ which are disposed horizontally, and m+1) ×(n−1) memory cells which are respectively disposed at the intersections of the word and complementary data lines. Each memory cell is composed of a data storing capacitor Cs and an N-channel type address selecting MOSFET Qm which are connected in series to each other. To each signal line of each pair of complementary data lines are coupled input/output nodes of m+1 memory cells which are disposed in the corresponding column, with a predetermined regularity as shown in FIG. 2. As will be described later, s+1 divided word lines are coupled to each word line, and to each divided word line are coupled the gates of the address selecting MOSFETs of (n+1) (s+1) memory cells which are disposed in the corresponding row. Thus, to each word line are coupled a total of n+1 memory cells which are disposed in the corresponding row.

Each pair of complementary data lines which constitute the memory array M-ARY are coupled at one end thereof to a corresponding unit circuit USA of a sense amplifier circuit SA through a corresponding precharge MOSFET of a precharge circuit PC. The precharge circuit PC consists of n+1 switching MOSFETs as representatively shown by N-channel MOSFETs Q7 and Q8 which are respectively provided between the complementary data lines DO and $\overline{DO}$ and between Dn and $\overline{Dn}$. The gates of these switching MOSFETs Q7 and Q8 are supplied with a precharge timing signal $\phi pc$ which is raised to a high level when the chip is in a non-selected state. Thus, each switching MOSFET is turned ON when the dynamic type RAM is in a non-selected state to short the non-inverting signal line and inverting signal line defined by each pair of complementary data lines which have been set to either a high or low level by the amplifying operation of the sense amplifier SA (described later) in the previous memory access, thereby setting the signal lines at a half-precharge level which is about ½ of a power supply voltage Vcc.

This half-precharge system enables a half-precharge level to be formed simply by shorting two signal lines which define each pair of complementary data lines, so that it is possible to lower the power consumption. In the amplifying operation of the sense amplifier circuit SA (described later), the potential of each signal line of each pair of complementary data lines changes from the half-precharge level to either a high or low level in a common mode. Accordingly, it is possible to increase the speed of the read operation and lower the level of noise which is generated by capacitance coupling.

Each unit circuit USA of the sense amplifier circuit SA is defined by a CMOS latch circuit consisting of P-channel MOSFETs Q3, Q4 and N-channel MOSFETs Q5, Q6, as shown in FIG. 2. The input/output nodes of each unit circuit USA are coupled to the corresponding complementary data lines DO·$\overline{DO}$ to Dn·$\overline{Dn}$. Although not necessarily limitative, the latch circuit is supplied with the power supply voltage Vcc through a sense amplifier driving circuit which is composed of P-channel MOSFETs Q1, Q2 connected in parallel and the latch circuit is further supplied with a ground voltage of the circuit through another sense amplifier driving circuit which is composed of N-channel MOSFETs Q13, Q14 connected in parallel. These sense amplifier driving circuits are mutually employed for a plurality of unit circuits of the sense amp.ifier circuit SA which are provided in correspondnece to other columns in the same memory mat. More specifically, the sources of the P- and N-channel MOSFETs which respectively constitute unit circuits in the same memory mat are mutually connected to common source lines PS and NS, resepectively. The MOSFETs Q1 and Q13 which constitue the sense amplifier driving circuits are arranged to have a smaller conductance than that of the other MOSFETs Q2 and Q14.

The gates of the MOSFETs Q1 and Q13 of the sense amplifier driving circuits are supplied with complementary timing signals $\phi pa1$ and $\overline{\phi pa1}$, resepectively, for activating the sense amplifier SA when the dynamic type RAM is in an operative state, whereas the gates of the MOSFETs Q2 and Q14 are supplied with complementary timing signals φpa2 and φ̄pa2, respectively which are formed slightly after teh complementary timing signals φpal and φ̄pal. Thus, the amplifying operation of teh sense amplifier SA is carried out in two stages. More specifically, in the first stage wherein the complementary timing signals φpal and φ are formed, a minute read signal from a selected memory cell given through the corresponding pair of complementary data lines is amplified in the corresponding unit circuit of the sense amplifier circuit SA without any undesirable level fluctuation by virtue of the current limiting action of the MOSFETs Q1 and Q13 having a relatively small conductance. After the potential difference between two signal lines constituting the complementary data lines has been amplified to a certain extent by such amplifying operation of the sense amplifier circuit SA, the complementary timing pulses φpa2 and φ̄pa2 are formed to commence the second stage of the amplifying operation, in which the MOSFETs Q2 and Q14 having a relatively large conductance are turned ON. The amplifying operation of the sense amplifier circuit SA is sped up by the action of the MOSFETs Q2 and Q14 which have a relatively large current supply capacity, so that the level of each of signal lines constituting the pair of complementary data lines is enlarged quickly to either a high or low level. The amplifying operation of the sense amplifier circuit SA that is carried out in two stages as described above enables achievement of a high-speed data read operation while preventing an undesirable level change of the complementary data lines.

Each pair of complementary data lines is connected at the other end thereof to complementary common data lines CD and $\overline{CD}$ selectively through the corresponding switching MOSFETs of a column switch CSW.

The column switch CSW consists of n+1 pairs of switching MOSFETs Q9·Q10 to Q11·Q12 which are coupled to the corresponding complementary data lines, respectively. The other terminals of these switching MOSFETs are mutually coupled to either a non-inverting common data line CD or an inverting common data line $\overline{CD}$ which constitute a pair of complementary common data lines. Thus, the column switch CSW functions to selectively connect the complementary data lines D0·$\overline{D0}$ to Dn·$\overline{Dn}$ to the common complementary data lines CD·$\overline{CD}$. The gates of each pair of switching MOSFETs which constitute the column switch CSW are mutually connected and supplied with the corresponding one of the data line select signal Y0 to Yn formed in a column address decoder CDCR.

The column address decoder CDCR decodes complementary internal address signals ay0 to ayi (herein, for example, an internal address signal ay0 which is in-phase with an external address signal AY) and an internal address signal $\overline{ay0}$ which is anti-phase with respect to the address signal AY0 are expressed in combination as "complementary internal address signal ay0"; the same rule applies to the following description) which are supplied from a column address buffer CADB, forms the above-described data line select signals Y0 to Yn in accordance with a data line select timing signal φy which is supplied from a timing control circuit TC, and supplies the data line select signals Y0 to Yn to the column switch CSW.

The column address buffer CADB receives Y-address signals AY0 to AYi which are supplied through external terminals A0 to Ai to form the complementary internal address signals ay0 to ayi and supplies them to the column address decoder CDCR. The dynamic type RAM in this embodiment employs the so-called address multiplex system in which Y-address signals AY0 to AYi for designating a column address and X-address signals AX0 to AXi for designating a row address are supplied through the same external terminals A0 to Ai in the time division manner. The X-address signals AX0 to AXi are supplied in synchronism with the fall of a row address strobe signal $\overline{RAS}$ which is externally supplied as a control signal, and the Y-address signals AY0 to AYi are supplied in synchronism with the fall of a column address strobe signal $\overline{CAS}$ which is also externally supplied as a control signal. Accordingly, the column address buffer CADB is activated by a timing signal φac which is formed in the timing control circuit TC when detecting a fall of the column address strobe signal $\overline{CAS}$, to incorporate and hold Y-address signals AY0 to AYi supplied to the external terminals A0 to Ai and also to form and supply complementary internal address signals ay0 to ayi to the column address decoder CDCR.

On the other hand, the gates of the address selecting MOSFETs of memory cells which are disposed in the same row of the memory array M-ARY are coupled to the corresponding one of the word lines W0 to Wm through the corresponding divided word lines as will be described later. The word lines W0 to Wm are coupled to a row address decoder, and among them, one word line which is designated by the X-address signals AX0 to AXi is selected.

Although not necessarily limited to this, the row address decoder consists of two stages, that is, it is composed of a combination of a primary row address decoder RDCR1 and a secondary row address decoder RDCR2. The primary row address decoder RDCR1 decodes two lower bits, i.e., ax0 and ax1, of the complementary internal address signals to form four word line select timing signals φx00 to φx11 (not shown) which are synchronized with a timing signal φx supplied from the timing control circuit TC. These word line select timing signals are combined with a common select signal which is formed by the secondary row address decoder RDCR2 which decodes the complementary internal address signals other than the lower two bits, that is, ax2 to axi, thus forming a word line select signal (one of the signals W0 to Wm) for selecting one word line which is designated by the X-address signals AX0 to AXi.

By composing the row address select circuit of the above-described two stages, it is possible to make the layout pitch (spacing) of unit circuits of the secondary row address decoder RDCR2 coincident with the layout pitch of the word lines, and it is therefore possible to obtain an efficient layout on the semiconductor substrate.

The row address buffer RADB receives and holds row address signals which are supplied from an address multiplexer AMX and also forms complementary internal address signals ax0 to axi and supplies them to the primary and secondary row address decoders RDCR1, RDCR2.

The dynamic type RAM in this embodiment is provided with an automatic refresh mode for reading storage data from a memory cell and rewriting it within a predetermined period and is therefore provided with a refresh address counter REFC for designating a word line which is to be refreshed in the automatic refresh mode. The address multiplexer AMX selects X-address signals AX0 to AXi supplied through the external terminals A0 to Ai and refresh address signals cx0 to cxi supplied from the refresh address counter REFC in accordance with a timing signal $\phi$ref which is supplied from the timing control circuit TC, and transfers the selected address signals to the row address buffer RADB as row address signals. More specifically, in a normal memrry access mode in which the timing signal $\phi$ref is set at a low level, the address multiplexer AMX selects the X-address signals AX0 to AXi which are supplied from an external unit through the external terminals A0 to Ai, whereas, in an automatic refresh mode in which the timing signal $\phi$ref is set at a high level, the address multiplexer AMX selects the refresh address signals cx0 to cxi which are output from the refresh address counter REFC.

Since the X-address signals AX0 to AXi are supplied in synchronism with a fall of the row address strobe signal $\overline{RAS}$ which is externally supplied as a control signal, the row address buffer RADB incorporates the row address signals in accordance with a timing signal $\phi$ar which is formed in the timing control circuit TC when detecting a fall of the row address strobe signal $\overline{RAS}$.

As shown in FIG. 2, to the complementary common data lines CD and $\overline{CD}$ are coupled input terminals of a main amplifier MA and also output terminals of a data input buffer DIB.

The main amplifier MA further amplifies a binary read signal which is transferred thereto from the selected complementary data lines through the complementary common data lines CD and $\overline{CD}$ and transfers the amplified signal to a data output buffer DOB. When the dynamic type RAM is in a read operation mode, the data output buffer DOB is activated by a timing signal $\phi$r supplied from the timing control circuit TC to output the output signal from the main amplifier MA to an external unit from an output terminal Dout. When the dynamic type RAM is in either a non-selected state or a write operation mode, the output of the data output buffer DOB is brought into a high-impedance state.

When the dynamic type RAM is in the write operation mode, the data input buffer DIB is activated by a timing signal $\phi$w supplied from the timing control circuit TC to form write data supplied from an external unit through an input terminal Din into complementary write signals and transfer them to the complementary common data lines CD and $\overline{CD}$. When the dynamic type RAM is in either a non-selected state or a read operation mode, the output of the data input buffer DIB is brought into a high-impedance state.

When the dynamic type RAM is in the automatic refresh mode, the refresh address counter REFC counts the number of timing signals $\phi$c supplied from the timing control circuit TC to designate the address of a word line which is to be refreshed.

The timing control circuit TC forms the above-described various timing signals on the basis of the row address strobe signal $\overline{RAS}$, column address strobe signal $\overline{CAS}$ and write enable signal $\overline{WE}$, which are externally supplied as control signals, and supplies the timing signals to the various circuits.

FIG. 1 shows the arrangement of one example of the memory array M-ARY of the dynamic type RAM shown in FIG. 2. With a view to avoiding confusion, FIG. 1 exemplarily shows the layout of only a part of the memory array-M-ARY, a pair of complementary data lines DL, $\overline{DL}$, divided word lines DWLal to DWLas and DWLbl to DWLbs, each pair of which are coupled with two memory cells, respectively, which share one drain region for their address selecting MOSFETs, and a pair of adjacent word lines WLa and WLb which are coupled with these divided word lines.

In FIG. 1, each memory cell consists of a data storing capacitor Cs and an address selecting MOSFET having its gate region defined by the corresponding divided word line.

FIG. 4 is a sectional view taken along the line A–B of FIG. 1, which shows more specifically the arrangement of memory cells shown in FIG. 1. Prior to the description of the layout shown in FIG. 1, the arrangement of memory cells will be briefly explained with reference to FIG. 4.

In FIG. 4, memory cells are formed on a semiconductor substrate SUB made of single crystal P-type silicon, although not necessarily limited thereto. Each pair of adjacent memory cells share one drain region D for their address selecting MOSFETs. The semiconductor substrate SUB is provided therein with two N+ regions for forming the source regions S of two address selecting MOSFETs and one N+ region for forming a drain region D which is shared by the two address selecting MOSFETs. The surface of the semiconductor substrate SUB that includes these N+ regions is provided with a relatively thick field insulating film Fl and a relatively thin gate insulating film Gl. The field insulating film Fl and the gate insulating film Gl are formed from, for example, a silicon oxide film $SiO_2$. Other pairs of memory cells which are adjacent to the illustrated memory cell pair are isolated by the field insulating film Fl. A cell plate CP which is made of polycrystalline silicon (polysilicon) pSi is provided on the surface of the substrate SUB with the gate insulating film Gl interposed therebetween. When an appropriate positive voltage is applied to the cell plate CP, a channel is induced in that region of the semiconductor substrate SUB which opposes the cell plate CP and thus a data storing capacitor Cs which employs the gate insulating film Gl as a dielectric is formed between the channel and the cell plate CP.

Divided word lines DWLal and DWLbl are provided on the semiconductor substrate SUB through the insulating film at respective positions between the two source regions S and the shared drain region D. These divided word lines are, although not necessarily limited thereto, made from a double-layer film consisting of polycrystalline silicon pSi and a silicide Sic, for example, silicon molybdenum ($MoSi_2$), which has a larger conductivity than that of polycrystalline silicon pSi.

Since the dynamic type RAM in this embodiment has a relatively large storage capacity and a relatively high integration density, the shared drain region D is reduced to minimize the size of the memory cells. For this reason, the alignment tolerance for coupling the drain region D and a data line DL formed from an aluminum layer is reduced, so that it is difficult to directly couple them together. Therefore, a connection pad Pa is provided in such a manner as to be superposed on the pattern of the divided word lines DWLal and DWLbl. The connection pad Pa is made of polycrystalline silicon pSi, although not necessarily limited thereto, and the lower end of the pad Pa is coupled to the shared drain region D. The data line DL which is formed from an aluminum layer is coupled to the shared drain region D through the connection pad Pa.

The A( shunt system of the dynamic type RAM in this embodiment will next be explained with reference to FIG. 1. As shown in FIG. 1, the uppermost memory cells are coupled to the divided word lines DWLal and DWLbl and also to a non-inverting data line DL. Memory cells which are formed directly below the uppermost memory cells at a position which is ½ pitch offset therefrom are coupled to other divided word lines (not shown) and also to an inverting data line $\overline{DL}$.

The dynamic type RAM in this embodiment is provided with s+1 divided word lines as representatively shown by divided word lines DWLal to DWLas+1 and DWLbl to DWLbs, although not necessarily limited thereto. Each of the divided word lines DWLal and DWLas-1 is coupled with $(n+1)/2(s+1)$ memory cells, while each of the divided word lines other than these divided word lines is coupled with $(n+1)/(s+1)$ memory cells. Each divided word line is coupled to either the word line WLa or WLb at the portion marked with in FIG. 1. As representatively shown by the divided word line DWLbl in FIG. 1, each divided word line "intersects" the divided word line DWLal, DWLa2 or the like on the opposite side below its joint to the corresponding word line. In other words, DWLal is on the left side of WLb (which DWLbl is coupled to) while the top part of DWLa2 is on the right side of WLb. Thus, DWLbl "intersects" DWLal and DWLa2 in the sense of crossing from one side of WLb to the other side of it at the point of discontinuity between DWLal and DWLa2. Accordingly, in the case of, for example, the divided word line DWLbl, $(n+1)/2(s+1)$ memory cells which are on the right-hand side of one group of pairs of memory cells each of which share one drain region are coupled to that portion of the divided word line DWLbl which is above its joint to the word line WLb, and $(n+1)/2(s+1)$ memory cells which are on the left-hand side of another group of pairs of memory cells each sharing one drain region are coupled to that portion of the divided word line DWLbl which is below its joint to the word line WLb. The divided word line DWLal is coupled with $(n+1)/2(s+1)$ memory cells which are on the left-hand side of the uppermost group of memory cell pairs each of which share one drain region, while the divided word line DWLas+1 is coupled with $(r+1)/2(s.1)$ memory cells which are on the right-hand side of the lowermost group of memory cell pairs each of which share one drain region. Thus, each of the divided word lines except for the divided word lines DWLal and DWLas+1 is coupled with $(n+1)/2(s+1)$ memory cells which are disposed on each of the left- and right-hand sides of pairs of memory cells each sharing one drain region, that is, a total of $(n+1)/(s+1)$ memory cells. Further, each word line is coupled with $(n+1)/2$ memory cells which are disposed on each of the left- and right-hand sides of pairs of memory cells each sharing one drain region, that is, a total of $(n+1)$ memory cells.

By virtue of the above-described arrangement, even if mask misalignment in the direction of the data lines occurs during the process of manufacturing the dynamic type RAM in accordance with this embodiment, and this results in a change in the coupling capacitance formed between the connection pad Pa of each memory cell, that is, the data line, and the corresponding divided word line, the changes in the coupling capacitances between the whole of one divided word line and the data line are canceled by each other. More specifically, in the case where the position of the connection pad Pa shown in FIG. 4 is offset due to mask misalignment at two memory cells which share one drain region, if the coupling capacitance with respect to one divided word line increases, that of the coupling capacitance with respect to the other divided word line decreases inversely. As described above, each divided word line is coupled with first memory cells which are disposed at one side of one group of pairs of memory cells each sharing one drain region and also with second memory cells which are disposed at the other side of another group of pairs of memory cells each sharing one drain region, the numbers of the first and second memory cells being the same. Accordingly, changes in the coupling capacitances between one data line and a pair of adjacent word lines due to mask misalignment are canceled by each other. Thus, the coupling capacitances between the word and data lines are made uniform, and there is no fear of a particular word line having an extremely large coupling capacitance due to mask misalignment.

As described above, in the dynamic type RAM in accordance with this embodiment, each divided word line is arranged to intersect another divided word line on the opposite side at its joint to the corresponding word line, and each divided word line, i.e., each word line, is coupled with first memory cells which are disposed at one side of one group of pairs of memory cells each of which share one drain region and with second memory cells which are disposed at the other side of another group of pairs of memory cells each sharing one drain region, the numbers of the first and second memory cells being the same. Therefore, changes in the coupling capacitances between each data line and each pair of adjacent word lines due to mask misalignment are canceled by each other, and the coupling capacitances between the data and word lines are made uniform. Accordingly, it is possible to prevent the address selecting MOSFET of a non-selected memory cell from being weakly turned ON, which phenomenon would otherwise be caused by induction in a non-selected word line from a level change in a data line in accordance with the data stored in a memory cell coupled to a selected word line. Thus, it is possible to improve the read margin of the dynamic type RAM.

Advantageous effects which are obtained by practicing a typical one of the inventions disclosed in this application will be briefly explained below:

(1) Each divided word line is arranged to intersect another divided word line on the opposite side at its junction to the corresponding word line, and each divided word line, and, hence, each word line, is coupled with first memory cells which are disposed at one side of one group of pairs of memory cells each of which share one drain region and with second memory cells which are disposed at the other side of another group of pairs of memory cells each sharing one drain region, the numbers of the first and second memory cells being the same or substantially the same, whereby it is advantageously possible to cancel changes in the coupling capacitances between each data line and each pair of adjacent word lines due to mask misalignment, and make uniform the coupling capacitances between the data and word lines. In addition, it is possible to eliminate the presence of a word line having an extremely large coupling capacitance between the same and the data lines.

(2) By virtue of the advantageous effect (1), it is possible to reduce the array noise induced in a non-selected word line by a level change in a data line which is caused in accordance with the data stored in a memory cell coupled to a selected word line. Thus, it is advantageously possible to prevent an erroneous operation of the address selecting MOSFET of a non-selected memory cell.

(3) Since layout is carried out by making use of the joint of each divided word line and the corresponding word line, no additional space is required for divided word lines to intersect each other. Accordingly, it is possible to obtain the advantageous effects (1) and (2) without any increase in the chip size.

(4) By virtue of the above-described advantageous effects (1) to (3), it is possible to realize a high integration and large capacity dynamic type RAM which has an improved read operation margin.

Although the present invention has been specifically described above by way of one embodiment, it should be noted here that the invention is not necessarily limited to the described embodiment and various changes or modifications may, of course, be imparted thereto without departing from the gist of the invention. For example, although in the arrangement shown in FIG. 1 each divided word line is coupled to the corresponding word line at its substantially central portion, each divided word line may be coupled to the corresponding word line at either the uppermost or lowermost portion thereof as shown in FIG. 5. The arrangement may also be such that, as shown in FIG. 6, no divided word lines intersect each other, but each divided word line is coupled only with memory cells which are disposed at one side of one group of pairs of memory cells each sharing one drain region, and each word line is coupled with first divided word lines to which are coupled memory cells which are disposed at one side of pairs of memory cells each sharing one drain region and is also coupled with second divided word lines to which are coupled memory cells which are disposed at the other side of pairs of memory cells each sharing one drain region, the numbers of the first and second divided word lines being the same, thereby making uniform the coupling capacitances of the word lines. Each divided word line and the corresponding word line may be coupled together not only on a memory cell or a memory cell array but also a region for the above-described coupling which is provided between memory cell array sections which are defined by appropriately dividing the memory cell array. In this case, a field insulating film is formed over those portions of the principal surface of the semiconductor substrate which correspond to the regions for the coupling. Thus, it is possible to prevent occurrence of a failure due to etching or the like carried out to form contact holes or the like for effecting the above-described coupling. The divided word lines shown in FIG. 4 may be formed using polycrystalline silicon alone, and the materials used for the word lines and the other portions are not necessarily limited to those employed in the illustrated arrangement further, various embodiment forms may be adopted in regard to the practical circuit block arrangement of the dynamic type RAM shown in FIG. 2, the combination of control signals, and the like.

An alternative Al shunt system of the dynamic type RAM will next be explained with reference to FIG. 7. As shown in FIG. 7, the uppermost memory cells are coupled to the divided word lines DWLa1 and also to a non-inverting data line DL. Memory cells which are formed directly below the uppermost memory cells at a position which is ½ pitch offset therefrom are coupled to the other divided word line DWLb1 and also to an inverting data line $\overline{DL}$. This ½ pitch offset between the divided data lines DWLa and DWLb continues to the lower two rows of the memory cells, as shown in FIG. 7. In this case, also, changes in the coupling capacitances between each data line and each pair of adjacent word lines due to mask misalignment can be cancelled.

Although in the foregoing description, the invention accomplished by the present inventors has been explained by way of one embodiment in which the invention is applied to a dynamic type RAM formed using one-element type memory cells which is an applicable field of the invention, the present invention is not necessarily limited to the described embodiment but may also be applied to various other dynamic type RAMs employing similar memory cells and to various digital devices incorporating such dynamic type RAMs. The present invention may be applied to dynamic type RAMs which, at least, employ one-element type dynamic memory cells and adopt the Al shunt system, and to semiconductor integrated circuit devices incorporating such dynamic type RAMs.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. A semiconductor integrated circuit device comprising:
   (a) a plurality of blocks arranged in columns on a semiconductor substrate;
   (b) a plurality of first and second word lines disposed in rows and exending in columns, wherein said first and second word lines are divided at every block;
   (c) a plurality of first semiconductor regions formed at the surface of said semiconductor substrate and positioned between said first and second word lines;
   (d) a plurality of second semiconductor regions formed at the surface of said semiconductor substrate and positioned at outside edges of said first and second word lines, wherein said first semiconductor regions, said second semiconductor regions and said first and second word lines form a plurality of first and second MOSFETs, wherein each of said first MOSFETs shares one of said first semiconductor regions with one of said second MOSFETs;
   (e) a plurality of capacitor elements each connected to said second semiconductor regions so as to connect said each of said capacitor elements to said first and second MOSFETs in series;
   (f) a plurality of first conductive layers connected to said first semiconductor regions and overlapping said first and second word lines;
   (g) a plurality of data lines connected to said first conductive layers and extending in rows; and
   (h) a plurality of further word lines formed in rows and extending in columns over said plurality of blocks, wherein one of said first word lines in one of said blocks and one of said second word lines in an adjacent block to said one of said blocks are connected to one of said plurality of further word lines.

2. A semiconductor integrated circuit device according to claim 1, wherein first memory cells which are disposed at one of said first word lines in one of said blocks and second memory cells which are disposed at one of said second word lines in an adjacent block to said one of said blocks are coupled to each of said one of said first and second word lines, the numbers of first and second memory cells being the same or substantiallyl the same.

3. A semiconductor integrated circuit device according to claim 1, wherein said further word lines are formed from an aluminum layer.

4. A semiconductor integrated circuit device according to claim 1, wherein said first and second word lines are formed from a polycrystalline silicon layer.

5. A semiconductor integrated circuit device according to claim 1, wherein said first and second word lines are formed from a silicide layer.

6. A semiconductor integrated circuit device according to claim 1, wherein said first and second word lines are formed from a double-layer film which is composed of a polycrystalline silicon layer and a silicide layer.

7. A semiconductor integrated circuit device according to claim 1, wherein said one of said first word lines in one of said blocks and said one of said second word lines in the adjacent block to said one of said blocks are connected to each other by a connection formed of the same material as that of said first and second word lines.

8. A semiconductor integrated circuit device according to claim 1, wherein said one of said first word lines in one of said blocks and said one of said second word lines in the adjacent block to said one of said blocks are connected to said one of said plurality of further word lines at the portion between memory cell array section.

9. A semiconductor integrated circuit device according to claim 1, wherein the number of said first and second word lines connected to said one of said further word lines is equal.

10. A semiconductor integrated circuit device comprising:
(a) a plurality of memory blocks arranged in column on a semiconductor substrate;
(b) a plurality of first and second word lines disposed in row and extending in column, wherein said first and second word lines are divided in each block;
(c) a plurality of first semiconductor regions formed at the surface of said semiconductor substrate and positioned between said first and second word lines;
(d) a plurality of second semiconductor regions formed at the surface of said semiconductor substrate and positioned at outside edges of said first and second word lines, wherein said first semiconductor regions, said second semiconductor regions and said first and second word lines form a plurality of first and second MOSFETs, wherein each of said first MOSFETs shares one of said first semiconductor regions with one of said second MOSFETs;
(e) a plurality of capacitor elements each connected to said second semiconductor regions so as to connect said each of said capacitor elements to said first and second MOSFETs in series;

(f) a plurality of first conductive layers connected to said first semiconductor regions and overlapping said first and second word lines;
(g) a plurality of data lines connected to said first conductive layers and extending in row; and
(h) a plurality of further word lines formed in row and extending in column over said plurality of blocks, wherein one of said first word line in one of said blocks and one of said second word line in an adjacent block to said one of said blocks are connected to one of said plurality of further word lines.

11. A semiconductor integrated circuit device having a plurality of memory cells each comprising a MISFET and capacitor element connected in series in row and column, comprising:
(a) a plurality of first and second word lines disposed in row and extending in column, the first and second word lines are adjacent each other and integral with gate electrodes of a first and second MISFETs of said memory cells;
(c) a plurality of first semiconductor regions as one of source and drain regions of said first and second MISFETs, the first semiconductor regions each formed at a surface of a semiconductor substrate and positioned between said first and second word lines, wherein each of said first and second MISFETs shares one of said first semiconductor regions;
(d) a plurality of conductive layers each connecting one of said first semiconductor regions to one of said data lines and overlapping said first and second word lines;
(e) a plurality of second and third semiconductor regions as another source and drain regions of said first and second MISFETs, the second and third semiconductor regions each formed at said surface of said semiconductor substrate and connected to said capacitor element; and
(f) a plurality of further word lines formed in row and extending in column, each connected to one of said first and second MISFETs in row, wherein the number of said first MISFETs connected to one of said plurality of further word lines is equal to the number of said second MISFETs connected to said one of said plurality of further word lines.

12. A semiconductor integrated circuit device according to claim 11, wherein said further word lines are foremd from an aluminum layer.

13. A semiconductor integrated circuit device according to claim 12, wherein said further word lines are connected to a row address decoder.

14. A semiconductor integrated circuit device according to claim 11, wherein said first and second word lines are formed from a polycrystalline silicon layer.

15. A semiconductor integrated circuit device according to claim 11, wherein said first and second word lines are formed from a silicide layer.

16. A semiconductor integrated circuit device according to claim 11, wherein said first and second word lines are formed from a double-layer film which is composed of a polycrystalline silicon layer and a silicide layer.

17. A semiconductor integrated circuit device having a plurality of memory cells each comprising a MISFET and capacitor element connected in series in row and column, comprising:
(a) a plurality of first and second word lines disposed in row and extending in column, the first and second word lines are adjacent each other and integral with gage electrodes of a first and second MISFETs of said memory cells;

(b) a plurality of data lines disposed in column and extending in row;

(c) a plurality of first semiconductor regions as one of source and drain regions of said first and second MISFETs, the first semiconductor regions each formed at a surface of a semiconductor substrate and positioned between said first and second word lines, wherein each of said first and second MISFETs shares one of said first semiconductor regions;

(d) a plurality of conductive layers each connecting one of said first semiconductor regions to one of said data lines and overlapping said first and second word lines;

(e) a plurality of second and third semiconductor regions as another of source and drain regions of said first and second MISFETs, the second and third semiconductor regions each formed at said surface of said semiconductor substrate and connected to said capacitor element; and (f) a plurality of further word lines formed in row and extending in column, each connected to said first and second word lines, wherein the number of said first word lines connected to one of said plurality of further word lines is equal to the number of said second word lines connected to said one of said plurality of further word lines.

18. A semiconductor integrated circuit device according to claim 17, wherein said further word lines are formed from an aluminum layer.

19. A semiconductor integrated circuit device according to claim 18, wherein said further word lines are connected to a row address decoder.

20. A semiconductor integrated circuit device according to claim 17, wherein said first and second word lines are formed from a polycrystalline silicon layer.

21. A semiconductor integrated circuit device according to claim 17, wherein said first and second word lines are formed from a silicide layer.

22. A semiconductor integrated circuit device according to claim 17, wherein said first and second word lines are formed from a double-layer film which is composed of a polycrystalline silicon layer and a silicide layer.

* * * * *